(12) United States Patent
Sun et al.

(10) Patent No.: US 10,410,954 B2
(45) Date of Patent: Sep. 10, 2019

(54) COOLING MODULE, WATER-COOLED COOLING MODULE AND COOLING SYSTEM

(71) Applicant: COOLER MASTER CO., LTD., New Taipei (TW)

(72) Inventors: Chien-Hung Sun, New Taipei (TW); Lei-Lei Liu, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 266 days.

(21) Appl. No.: 14/735,559

(22) Filed: Jun. 10, 2015

(65) Prior Publication Data
US 2016/0330868 A1 Nov. 10, 2016

(30) Foreign Application Priority Data
May 5, 2015 (TW) .............................. 104206825 U (51) Int. Cl.
| | |
|---|---|
| *H01L 23/427* | (2006.01) |
| *H01L 23/46* | (2006.01) |
| *F28D 15/02* | (2006.01) |
| *H01L 23/473* | (2006.01) |
| *H05K 7/20* | (2006.01) |
| *F28D 21/00* | (2006.01) |

(52) U.S. Cl.
CPC ............ *H01L 23/427* (2013.01); *F28D 15/02* (2013.01); *F28D 15/0275* (2013.01); *H01L 23/46* (2013.01); *H01L 23/473* (2013.01); *H05K 7/20336* (2013.01); *F28D 2021/0028* (2013.01); *F28D 2021/0029* (2013.01); *F28F 2265/14* (2013.01)

(58) Field of Classification Search
CPC ............ F28D 15/02; F28D 2021/0028; F28D 2021/0029; F28D 15/0275; H01L 23/427; H01L 23/46; H01L 23/473; H05K 7/20336
USPC ......................................... 165/80.4; 257/715
See application file for complete search history.

(56) References Cited

U.S. PATENT DOCUMENTS

| | | | | |
|---|---|---|---|---|
| 5,760,333 | A * | 6/1998 | Kitahara | ............... H01L 23/427 165/80.3 |
| 6,082,443 | A * | 7/2000 | Yamamoto | .......... F28D 15/0233 165/104.21 |
| 6,889,756 | B1 * | 5/2005 | Hou | .................... F28D 15/0233 165/104.21 |
| 7,145,774 | B2 * | 12/2006 | Campini | ............. H01L 23/3677 361/719 |

(Continued)

FOREIGN PATENT DOCUMENTS

WO WO 2011093852 A1 * 8/2011 ............... G06F 1/20

*Primary Examiner* — Cassey D Bauer
*Assistant Examiner* — Jenna M Hopkins
(74) *Attorney, Agent, or Firm* — Maschoff Brennan (57) ABSTRACT

A cooling module used in conjunction with a heating element includes a vapor chamber and a plurality of cooling fins. The vapor chamber is in contact with one side of the heating element. The vapor chamber is disposed with a direct conduction area and a vacuum block disposed on two sides of the direct conduction area respectively. Each vacuum block forms a chamber. The cooling fins protrude from and are vertically disposed on the direct conduction area and each vacuum block, respectively. Thereby, the effects of fast vertical heat transfer to the fin and fast horizontal heat transfer to the distal cooling fins are achieved.

11 Claims, 8 Drawing Sheets

(56) References Cited

U.S. PATENT DOCUMENTS

| | | | | |
|---|---|---|---|---|
| 7,420,808 B2* | 9/2008 | Campbell | G06F 1/20 | 165/80.4 |
| 7,551,442 B2* | 6/2009 | Stefanoski | F28D 1/024 | 165/104.26 |
| 7,796,389 B2* | 9/2010 | Edmunds | H01L 23/427 | 165/104.14 |
| 8,247,956 B2* | 8/2012 | Liu | F21V 29/004 | 313/46 |
| 8,974,116 B2* | 3/2015 | Okamoto | G01K 1/14 | 361/690 |
| 2001/0025701 A1* | 10/2001 | Ikeda | H01L 23/427 | 165/80.3 |
| 2002/0023732 A1* | 2/2002 | Graf | F28F 1/32 | 165/80.3 |
| 2004/0196633 A1* | 10/2004 | Wong | F28D 15/0233 | 361/700 |
| 2005/0139995 A1* | 6/2005 | Sarraf | F28D 15/02 | 257/706 |
| 2005/0230086 A1* | 10/2005 | Wang | H01L 23/473 | 165/104.33 |
| 2006/0108097 A1* | 5/2006 | Hodes | F28F 3/048 | 165/80.4 |
| 2006/0118280 A1* | 6/2006 | Liu | H01L 23/427 | 165/104.33 |
| 2007/0017659 A1* | 1/2007 | Brunschwiler | H01L 23/427 | 165/80.4 |
| 2007/0017814 A1* | 1/2007 | Hwang | C25D 1/08 | 205/118 |
| 2007/0125522 A1* | 6/2007 | Stefanoski | F28D 1/024 | 165/104.21 |
| 2007/0204646 A1* | 9/2007 | Gagliano | F28D 15/0233 | 62/389 |
| 2007/0218706 A1* | 9/2007 | Matsuoka | F27B 5/04 | 438/781 |
| 2007/0295482 A1* | 12/2007 | Fitzgerald | H01L 23/427 | 165/80.4 |
| 2008/0105413 A1* | 5/2008 | Peng | F28F 3/048 | 165/104.33 |
| 2009/0260782 A1* | 10/2009 | Whitney | B21D 53/02 | 165/104.21 |
| 2009/0294104 A1* | 12/2009 | Lin | F28D 15/0233 | 165/104.26 |
| 2009/0308575 A1* | 12/2009 | Yao | F21K 9/00 | 165/80.3 |
| 2009/0314470 A1* | 12/2009 | Yang | F28D 15/0233 | 165/104.26 |
| 2010/0302725 A1* | 12/2010 | Busch | F28D 15/0233 | 361/679.47 |
| 2010/0326629 A1* | 12/2010 | Meyer, IV | F28D 15/0233 | 165/104.26 |
| 2011/0277966 A1* | 11/2011 | Lin | F28D 15/0275 | 165/104.26 |
| 2012/0312506 A1* | 12/2012 | Uchida | F28D 15/0266 | 165/104.21 |
| 2013/0048251 A1* | 2/2013 | Xiao | H01L 23/427 | 165/104.26 |
| 2013/0233521 A1* | 9/2013 | Uchida | F28D 15/0266 | 165/104.26 |
| 2013/0327505 A1* | 12/2013 | Gonzalez | F28F 3/00 | 165/104.26 |
| 2014/0036445 A1* | 2/2014 | Okamoto | H05K 7/20209 | 361/697 |
| 2014/0083653 A1* | 3/2014 | Kempers | F28F 13/04 | 165/104.26 |
| 2014/0321058 A1* | 10/2014 | Fujieda | G06F 1/203 | 361/700 |
| 2015/0179617 A1* | 6/2015 | Lin | H01L 23/04 | 257/713 |
| 2015/0219400 A1* | 8/2015 | Sasaki | H01L 23/427 | 165/104.26 |
| 2015/0285562 A1* | 10/2015 | Huang | B23P 15/26 | 165/104.21 |
| 2017/0115071 A1* | 4/2017 | Lin | F28F 3/02 | |
| 2017/0268828 A1* | 9/2017 | Lin | F28D 15/02 | |
| 2017/0314870 A1* | 11/2017 | Lin | F28D 15/00 | |
| 2018/0066897 A1* | 3/2018 | Lin | H05K 7/20336 | |
| 2019/0003775 A1* | 1/2019 | Lin | F28D 9/0062 | |

* cited by examiner

COOLING MODULE, WATER-COOLED COOLING MODULE AND COOLING SYSTEM

TECHNICAL FIELD

The disclosure relates to a cooling module, more particularly to a cooling module, a water-cooled cooling module and a cooling system which are capable of fast vertical and horizontal heat transfer.

BACKGROUND

Cooling technology is in line with the development of electronic products. During the operation of the electronic products, current in the circuit generates undesirable heat due to the impedance. When this heat cannot be dissipated effectively and goes to the electronic components inside the electronic products, it may damage these electronic components because of rising temperature. Hence, it is essential to dissipate the heat of the electronic components by, for example, the vapor chamber.

The conventional vapor chamber comprises a case in a rectangular shape and a capillary structure inside the chamber wall. Working fluid is filled into the inside of the case. One side of the case (namely the evaporation area) is attached to and extracts heat generated by a heating element (e.g. a CPU or north and south bridge chips). Thus, the working fluid (in liquid) evaporates at the evaporation area of the case and is converted into gas, and therefore transfers heat to the other side of the case (namely the condensing area). The working fluid (gas) is condensed into liquid by cooling at the condensing area. Then, the working fluid (liquid) flows back to the evaporation area by gravity or capillary structure, to form the circulation for uniform temperature and heat dissipation.

Although the conventional vapor chamber can transfer heat evenly, it fails to transfer heat to a distal end to dissipate heat, like a heat pipe. This makes the vapor chamber only useful in uniform heat transfer in large areas and not applicable to a heat transfer to a distal end. In other words, the conventional vapor chamber transferring heat along the X axis and Y axis is better than that transferring heat along the Z axis. Additionally, the conventional water-cooled cooling module pumps the coolant into the case by a pump and the coolant goes to the cooling fins directly. This way, the coolant is unable to flow to each cooling fin evenly and the water pressure of the coolant on each cooling fin is not even. Thereby, the conventional water-cooled cooling module fails to dissipate heat of each cooling fin effectively and this increases the temperature of the electronic device, which affects its performance negatively.

SUMMARY

One goal of the disclosure is to provide a cooling module, a water-cooled cooling module and a cooling system capable of fast vertical heat transfer to the fin and fast horizontal heat transfer to the distal cooling fins.

To reach this goal, the disclosure provides a cooling module, used in conjunction with a heating element, comprising a vapor chamber and a plurality of cooling fins. The vapor chamber is in contact with one side of the heating element. The vapor chamber is disposed with a direct conduction area and a vacuum block disposed on two sides of the direct conduction area respectively. Each vacuum block forms a chamber. The cooling fins protrude from and are vertically disposed on the direct conduction area and each vacuum block, respectively.

Furthermore, a water-cooled cooling module used in conjunction with a heating element comprises a vapor chamber in contact with one side of the heating element, a plurality of cooling fins and a water-cooled device. The vapor chamber is disposed with a direct conduction area and a vacuum block disposed on two sides of the direct conduction area respectively, wherein each vacuum block forms a chamber. The cooling fins protrude from and are vertically disposed on the direct conduction area and each vacuum block, respectively. The water-cooled device is sleeved on the vapor chamber and covers each cooling fin. The water-cooled device has a water inlet and a water outlet.

Moreover, a cooling system used in conjunction with a heating element comprises a vapor chamber in contact with one side of the heating element, a plurality of cooling fins, a water-cooled device, a pump and a heat sink. The vapor chamber is disposed with a direct conduction area and a vacuum block is disposed on two sides of the direct conduction area respectively, wherein each vacuum block forms a chamber. The cooling fins protrude from and are vertically disposed on the direct conduction area and each vacuum block, respectively. The water-cooled device is sleeved on the vapor chamber and covers each cooling fin. The water-cooled device has a water inlet and a water outlet. The pump is connected with the water outlet. The heat sink is connected to the water inlet.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
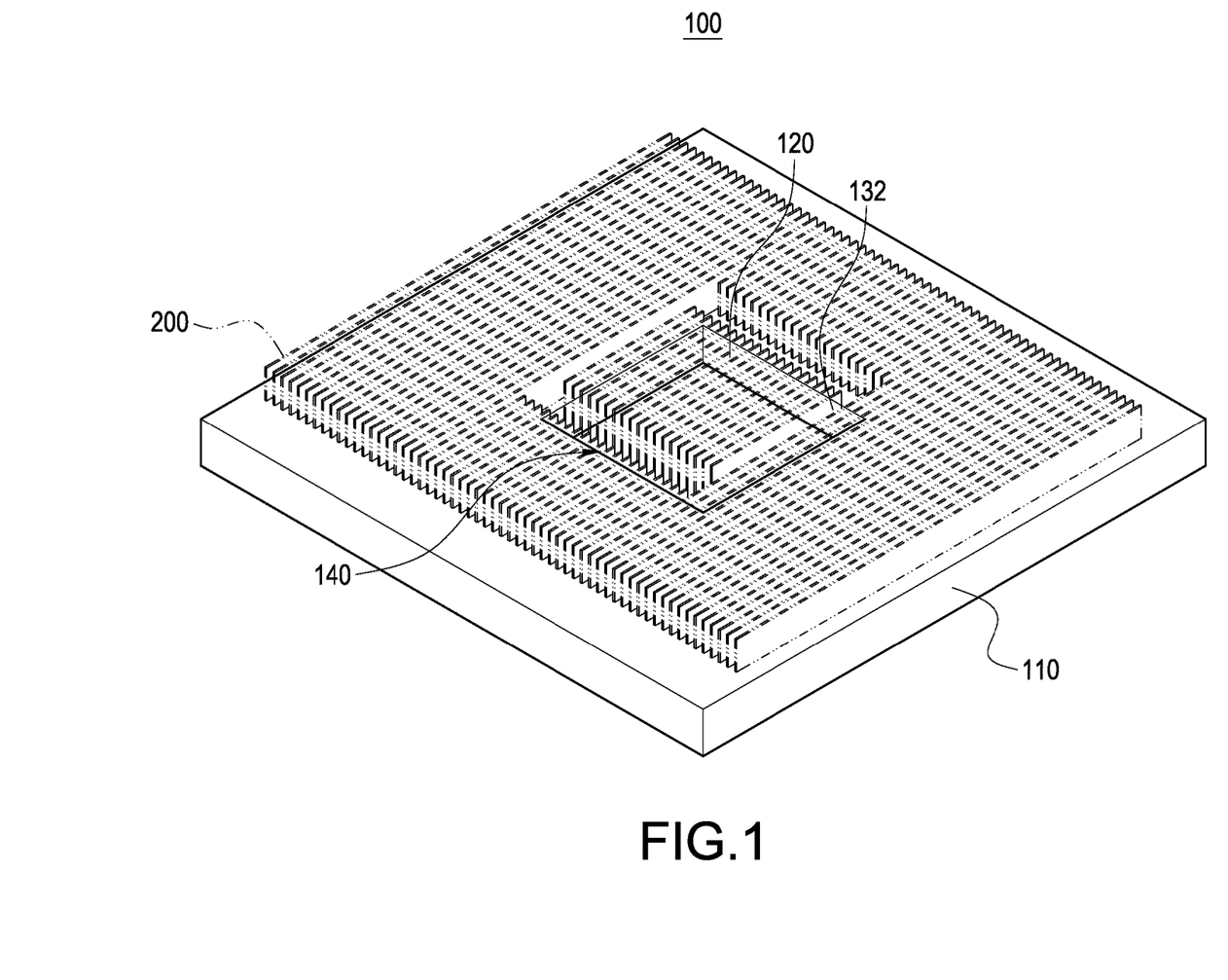
FIG. 1 is a perspective view of the first embodiment of the disclosure.
Figure 2:
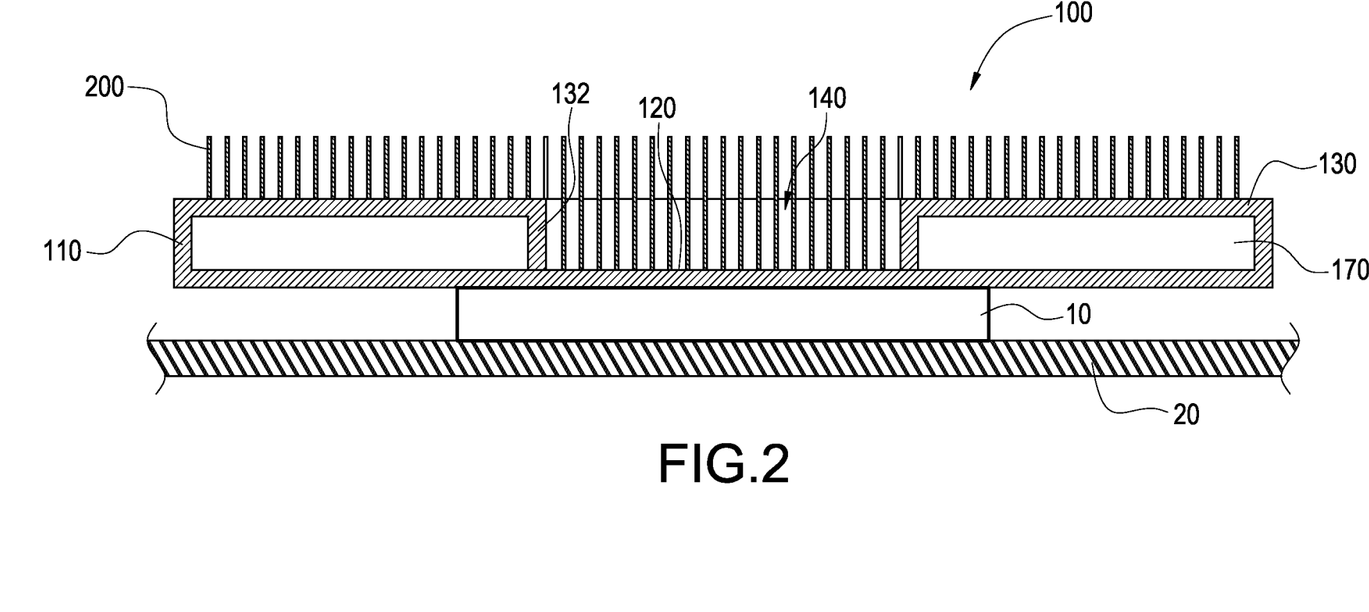
FIG. 2 is a sectional view of the first embodiment of the disclosure.

As seen in FIG. 1 and FIG. 2, the disclosure provides a cooling module 100, used in conjunction with a heating element 10. The heating element 10 refers to a chip or a CPU disposed on the substrate 20 which is a mother board or a circuit board. The cooling module 100 comprises a vapor chamber 110 and a plurality of cooling fins 200. The vapor chamber 110 is in contact with one side of the heating element 10. The vapor chamber 110 is disposed with a direct conduction area 120 and a vacuum block 130 disposed on two sides of the direct conduction area 120 respectively. Each vacuum block 130 forms a chamber 170. Each cooling fin 200 respectively protrudes from and is disposed on the direct conduction area 120 and each vacuum block 130 vertically.

Figure 8:
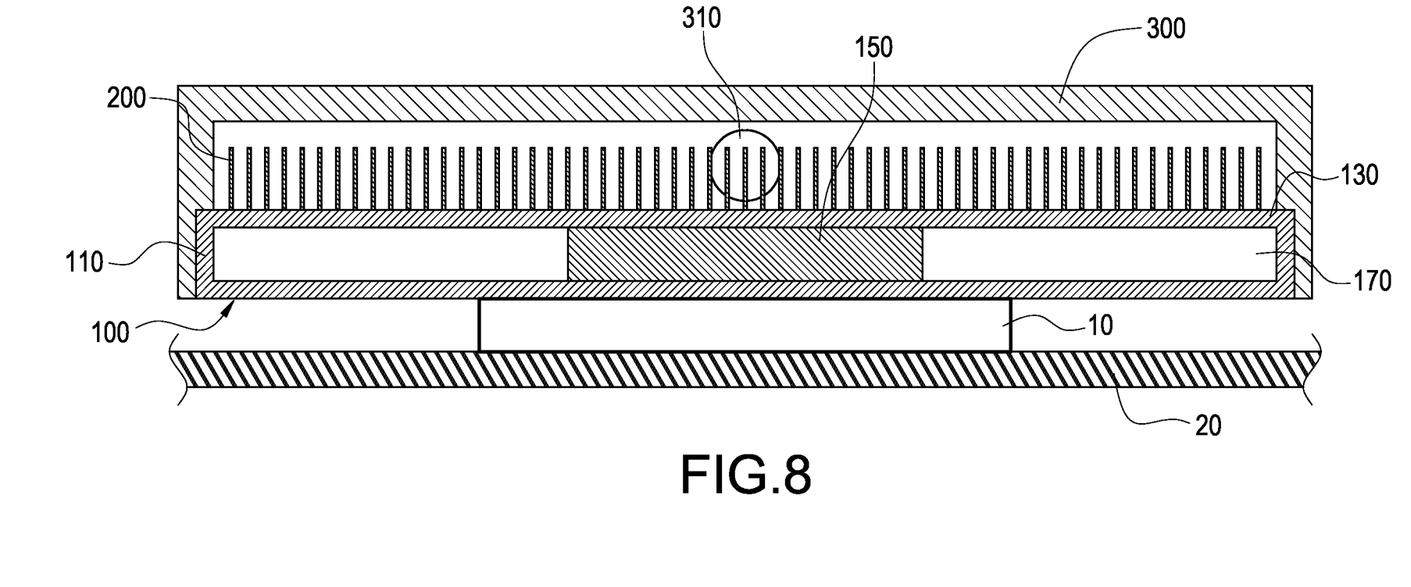
FIG. 8 is a sectional view of another embodiment of the disclosure.

The direction direct conduction area 120 comprises a concave 140 roughly at the center of the vapor chamber 110 or a transfer medium 150 (as shown in FIG. 8). In the embodiments of FIG. 1 and FIG. 2, the direct conduction area 120 is preferably to be the concave 140 and the shape thereof is, but not limited to, rectangular. A separation plate 132 is disposed around each vacuum block 130. The separation plate 132 faces downwardly and is sealed with the bottom surface of the vapor chamber 110 vertically, from the upper surface of the vapor chamber 110. That is, the bottom surface of the vapor chamber 110 and each separation plate 132 surround and form the concave 140. Generally speaking, the vapor chamber 110 and the separation plate 132 are made of copper, aluminum or an alloy thereof and are integrally formed. The chamber 170 is preferably to be a vacuum chamber for increasing the speed of heat transfer.

Moreover, the size of the direct conduction area 120 is preferably to be smaller than that of the heating element 10. In other words, the ends of the heating element 10 go over the direct conduction area 120 to the vacuum block 130, so that the heat of the heating element 10 can be transferred horizontally to the cooling fins 200 at the distal end via the vacuum block 130, which improves the efficiency of heat dissipation. In this embodiment, the direction conduction area 120 takes the advantage of the material of the vapor chamber 110 to dissipate heat vertically to the cooling fins 200 rapidly, thereby dissipating heat.

Figure 3:
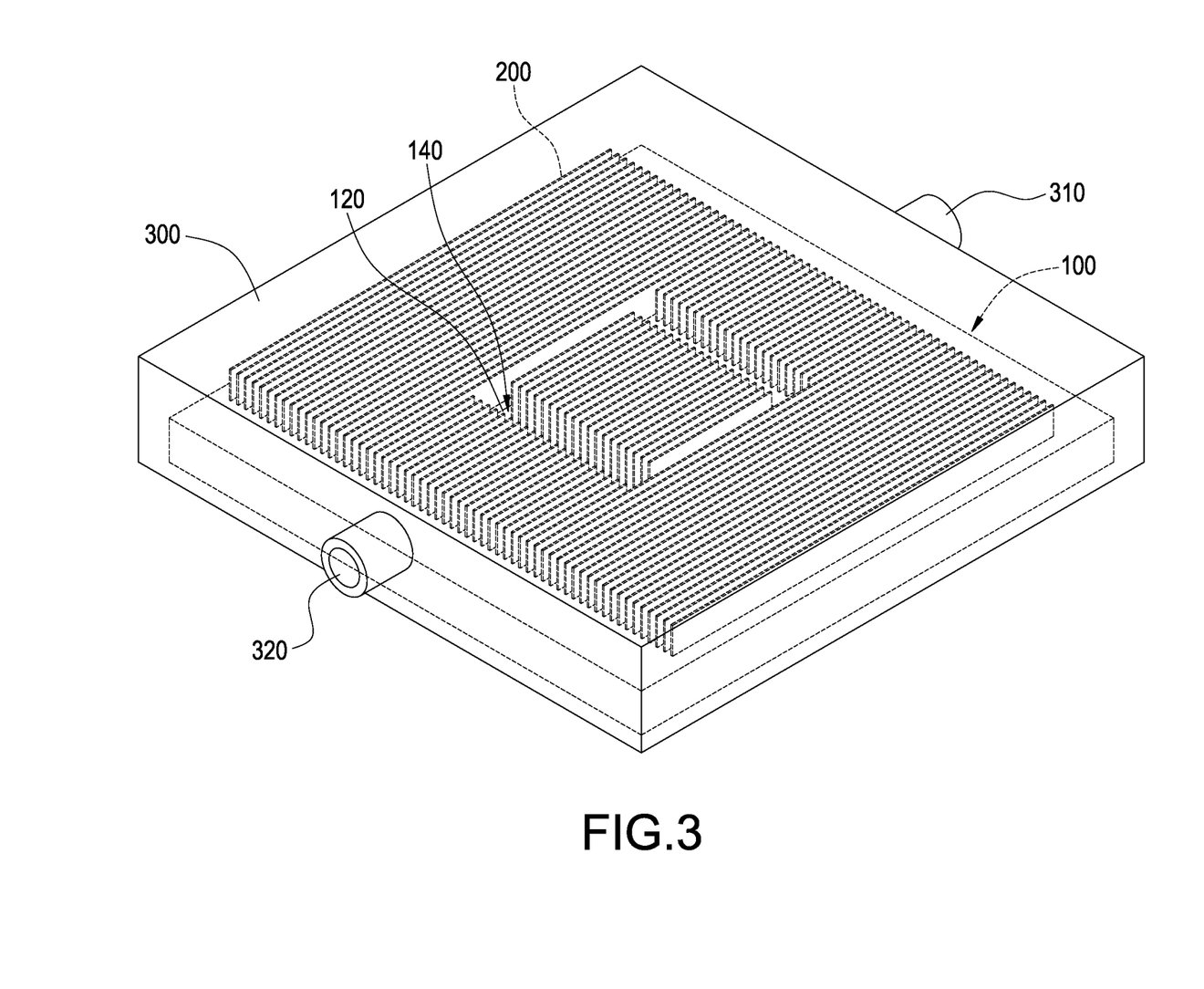
FIG. 3 is a perspective view of the second embodiment of the disclosure.
Figure 4:
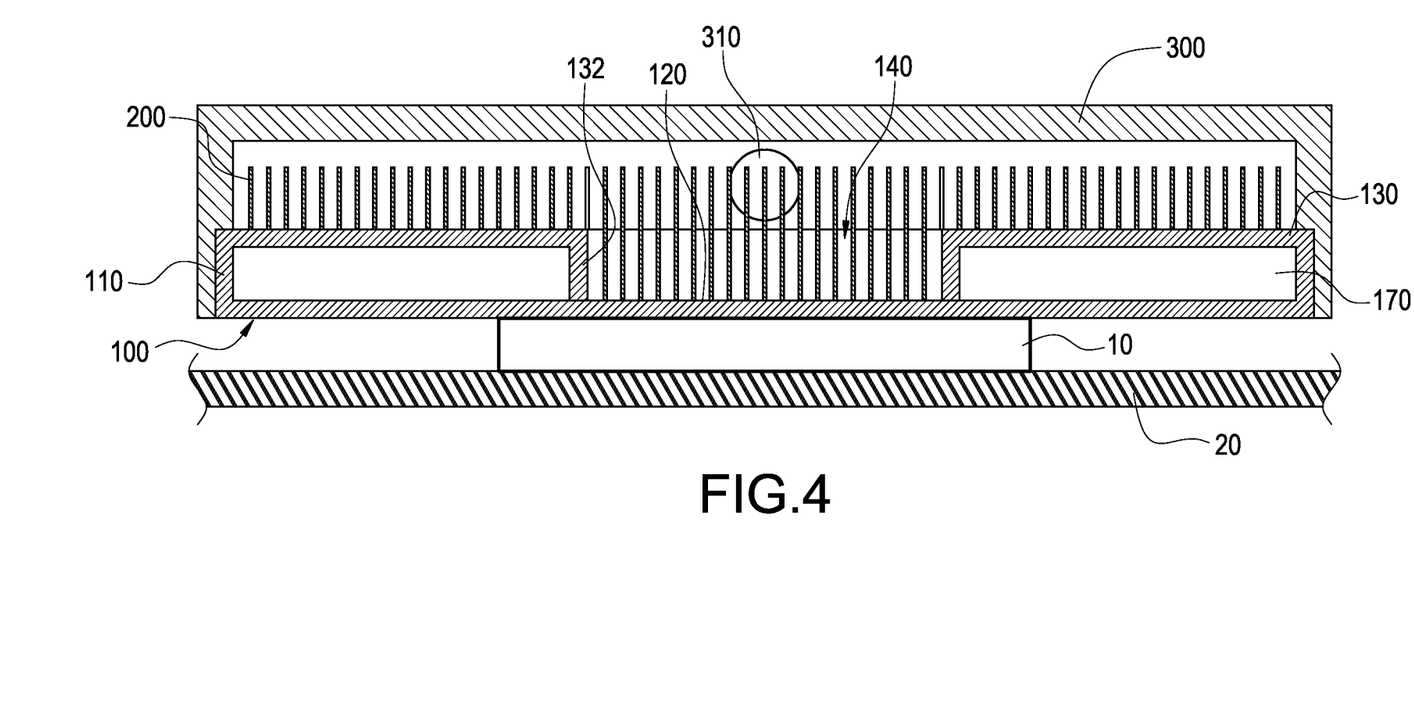
FIG. 4 is a sectional view of the second embodiment of the disclosure.
Figure 5:
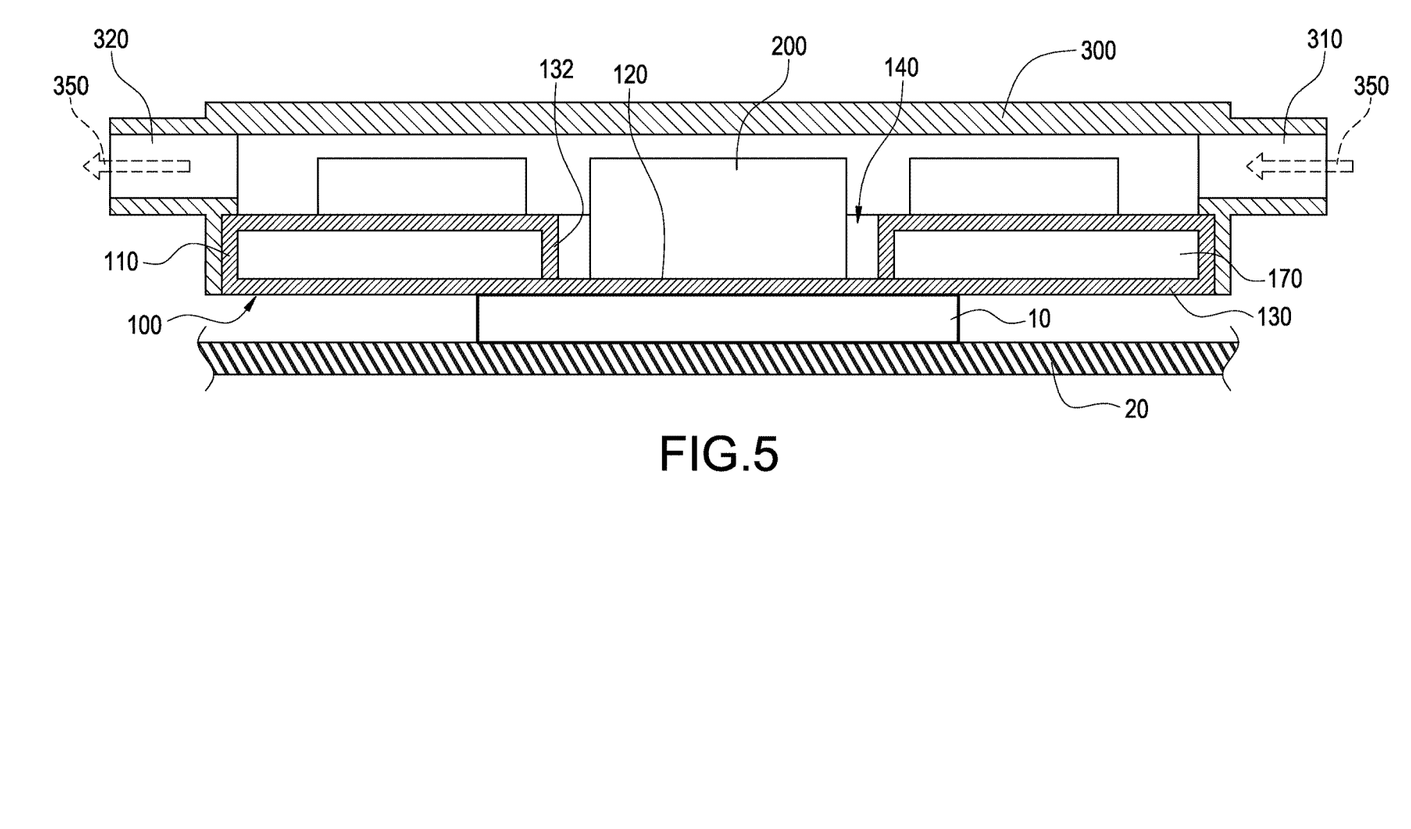
FIG. 5 is a sectional view of the second embodiment of the disclosure from another angle.
Figure 6:
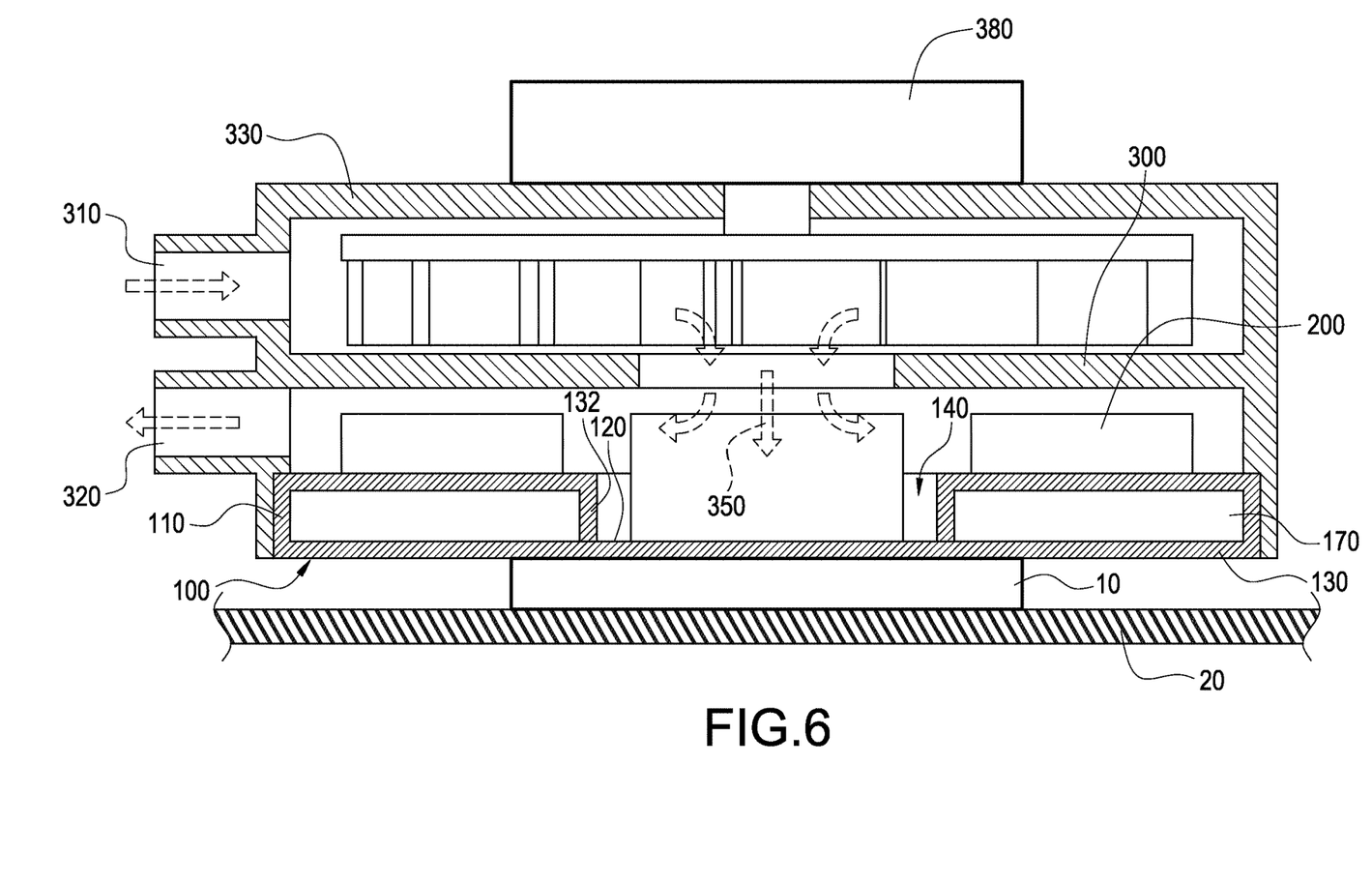
FIG. 6 is a sectional view of the second embodiment of the disclosure further with a pump disposed thereon.

FIG. 3, FIG. 4 and FIG. 5 show the second embodiment of the disclosure. The disclosure further provides a water-cooled cooling module 100. Similarly, it used in conjunction with a heating element 10. The differences between this embodiment and previous embodiment lie in that a water-cooled device 300 is further disposed. The rest structures are shown before so it will not be illustrated again. In the embodiment shown in FIG. 5, the water-cooled device 300 is sleeved on the vapor chamber 110 and covers each cooling fin 200. Besides, the water-cooled device 300 has a water inlet 310 and a water outlet 320 which preferably are disposed on two ends of the water-cooled device 300. However, the water inlet 310 and the water outlet 320 in the embodiment shown in FIG. 6 are disposed on the same side of the water-cooled device 300 so the disclosure is not limited to a specific structure thereof.

In this embodiment, the direction conduction area 120 is preferably to be a concave 140 located at the center of the vapor chamber 110. Additionally, a separation plate 132 is disposed around each vacuum block 130. From the upper surface of the vapor chamber 110, the separation plate 132 faces downwardly and is sealed with the bottom surface of the vapor chamber 110 vertically, Referring to FIG. 6, the water-cooled device 300 further comprises a pump 330 and a working fluid 350. The pump 330 is preferably disposed above the water-cooled device 300 and connects with the water-cooled device 300, so as to allow the working fluid 350 to flow therein. The working fluid 350 is preferably to be a coolant. The water inlet 310 is disposed on one side of the pump 330 while the water outlet 320 is disposed on another side of the water-cooled device 300. The working fluid 350 inputs from the water inlet 310 and outputs from the water outlet 320 so the working fluid 350 takes the heat away from the cooling fins 200. In this embodiment, a cooling fan 380 may be further added to the top of the pump 330 for improving the cooling rate.

Figure 7:
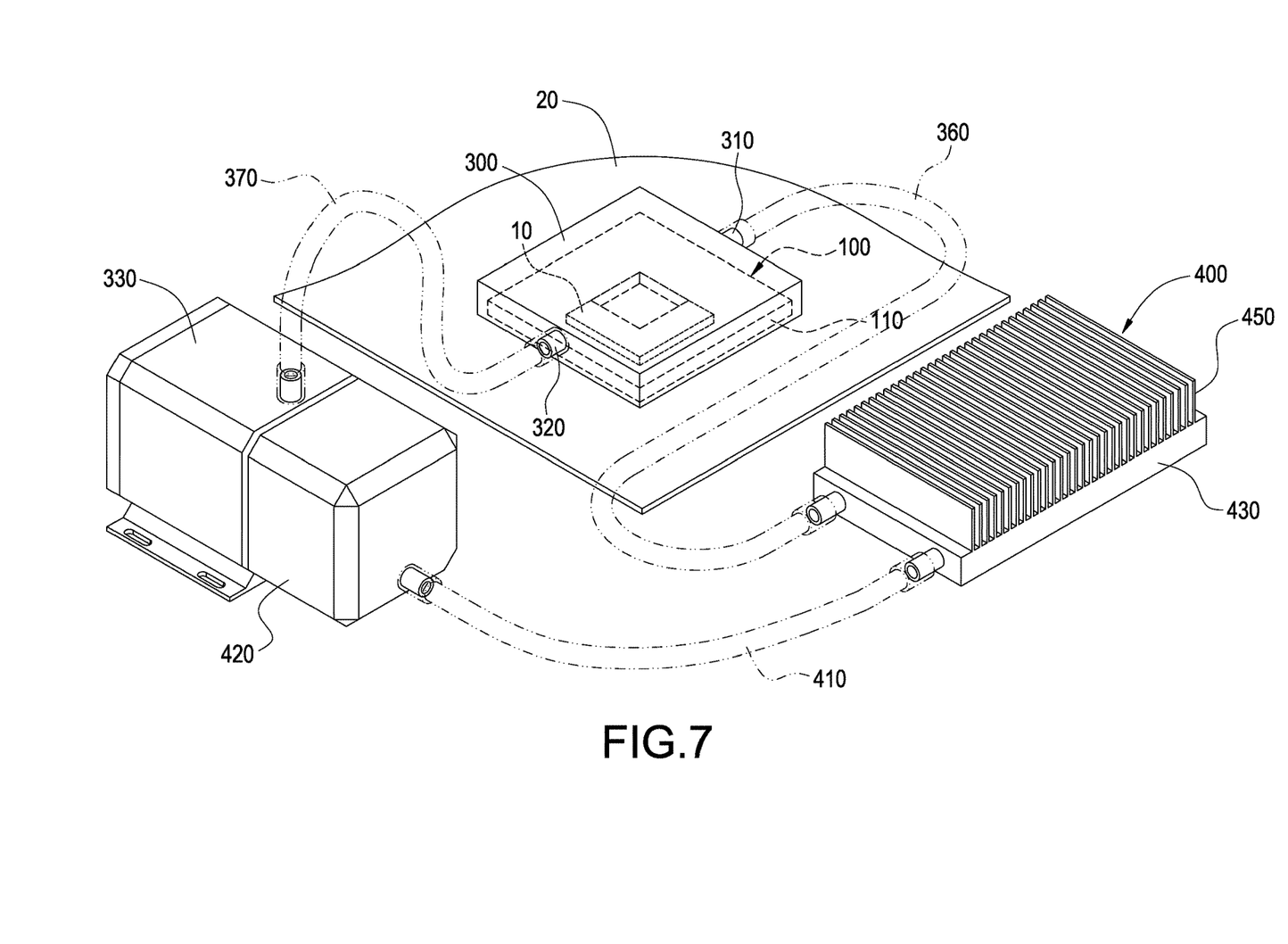
FIG. 7 is a perspective view of the third embodiment of the disclosure.

FIG. 7 is a perspective view of the third embodiment of the disclosure. The disclosure provides a cooling system used in conjunction with a heating element 10. The cooling system comprises a vapor chamber 110, a plurality of cooling fins (not shown in the figures), a water-cooled device 300, a pump 330 and a heat sink 400. The rest structures are illustrated in previous embodiments so they will not be illustrated here again.

In this embodiment, the pump 330 is preferably to be connected with the water outlet 320 while the heat sink 400 is connected to the water inlet 320. As seen in FIG. 7, the pump 330 is connected to the water outlet 320 via the pipeline 370 while the heat sink 400 is connected to the water inlet 310 via the pipeline 360. A water tank 420 for accommodating a working fluid 350 is disposed on one side of the pump 330, and the heat wink 400 comprises a heat exchange chamber 430 and a plurality of fins 450.

Additionally, this embodiment further comprises a connection pipeline 410 connecting the heat sink 400 and the pump 330. When the cooling system utilizes the water-cooled device 300 (e.g. when the water block is attached to the heating element 10), the pump 330 makes the working fluid 350 (namely, coolant) flow into the cooling module 100 via the water tank 420, in which it flows through the heat exchange chamber 430 and fins 450 and finally into the cooling module 100. The working fluid 350 takes the heat of the heating element 10 away from the water-cooled device 300 and the coolant goes to the water tank 420 via the water block, then back to the heat sink 400. Thereby, the circulation of coolant is formed for improving heat dissipation and this therefore reduces the temperature of the heating element 10.

Furthermore, FIG. 8 is another preferable embodiment of the disclosure. In this embodiment, the direct conduction area 120 is preferably to be a solid transfer medium 150 and the material thereof is copper, aluminum or an alloy thereof.

What is claimed is:

1. A cooling module used in conjunction with a heating element, comprising:
    a thermal plate in contact with one side of the heating element, wherein the thermal plate has a concavity and two chambers, the concavity is formed on an upper surface of the thermal plate opposite to a bottom surface which faces the heating element, the concavity is located at the center of the thermal plate, and the two chambers are respectively located on two sides of the concavity; and
    a plurality of cooling fins protruding from and vertically disposed on the thermal plate;
    wherein some of the plurality of cooling fins protrude through the concavity and are located between the two chambers, and a bottom plane of the concavity and a bottom plane of the two chambers are coplanar.

2. The cooling module according to claim 1, wherein the size of the concavity is smaller than the size of the heating element.

3. A water-cooled cooling module used in conjunction with a heating element, comprising:
    a thermal plate in contact with one side of the heating element, wherein the thermal plate has a concavity and two chambers, the concavity is formed on an upper surface of the thermal plate opposite to a bottom surface which faces the heating element, the concavity is located at the center of the thermal plate, and the two chambers are respectively located on two sides of the concavity;

a plurality of cooling fins protruding from and vertically disposed on the thermal plate; and a water-cooled device sleeved on the thermal plate and covering each cooling fin, the water-cooled device having a water inlet and a water outlet, wherein some of the plurality of cooling fins protrude through the concavity and are located between the two chambers, and a bottom plane of the concavity and a bottom plane of the two chambers are coplanar.

4. The water-cooled cooling module according to claim 3, wherein the water-cooled device further comprises a pump and a working fluid, the water inlet is disposed on one side of the pump while the water outlet is disposed on another side of the water-cooled device, the working fluid inputs to the water inlet and outputs from the water outlet.

5. The water-cooled cooling module according to claim 4, wherein the working fluid is a coolant.

6. The water-cooled cooling module according to claim 4, wherein the pump is disposed above the water-cooled device and connects with the water-cooled device, so as to allow the working fluid to flow therein.

7. A cooling system used in conjunction with a heating element, comprising:

a thermal plate in contact with one side of the heating element, wherein the thermal plate has a concavity and two chambers, the concavity is formed on an upper surface of the thermal plate opposite to a bottom surface which faces the heating element, the concavity is located at the center of the thermal plate, and the two chambers are respectively located on two sides of the concavity;

a plurality of cooling fins protruding from and vertically disposed on the thermal plate;

a water-cooled device sleeved on the thermal plate and covering each cooling fin, the water-cooled device having a water inlet and a water outlet;

a pump connected with the water outlet; and a heat sink connected to the water inlet, wherein some of the plurality of cooling fins protrude through the concavity and are located between the two chambers, and a bottom plane of the concavity and a bottom plane of the two chambers are coplanar.

8. The cooling system according to claim 7, further comprising a connection pipeline connected to the heat sink and the pump respectively.

9. The cooling system according to claim 8, wherein the pump is disposed with a water tank accommodating a working fluid, the connection pipeline is connected to the heat sink and the water tank.

10. The cooling system according to claim 7, wherein the heat sink comprises a heat exchange chamber and a plurality of fins.

11. A cooling module used in conjunction with a heating element, comprising:

a thermal plate in contact with one side of the heating element, wherein the thermal plate has a concavity and a chamber, the concavity is formed on an upper surface of the thermal plate opposite to a bottom surface which faces the heating element, the concavity is located at the center of the thermal plate, and the chamber surrounds the concavity; and a plurality of cooling fins protruding from and vertically disposed on the thermal plate;

wherein some of the plurality of cooling fins protrude through the concavity and are surrounded by the chamber, and a bottom plane of the concavity and a bottom plane of the chamber are coplanar.

* * * * *